US011950393B2

United States Patent
Liu et al.

(10) Patent No.: US 11,950,393 B2
(45) Date of Patent: Apr. 2, 2024

(54) TWO-PHASE FLOW ACTIVE AND PASSIVE MULTI-LEVEL DATA CENTER CABINET COOLING DEVICE AND METHOD

(71) Applicant: SOUTHEAST UNIVERSITY, Nanjing (CN)

(72) Inventors: Xu Liu, Nanjing (CN); Junming Du, Nanjing (CN); Haitao Jiang, Heifei (CN); Chengbin Zhang, Nanjing (CN); Dongping Yin, Hefei (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 321 days.

(21) Appl. No.: 17/620,628

(22) PCT Filed: Jun. 25, 2021

(86) PCT No.: PCT/CN2021/102365
§ 371 (c)(1),
(2) Date: Dec. 17, 2021

(87) PCT Pub. No.: WO2022/012302
PCT Pub. Date: Jan. 20, 2022

(65) Prior Publication Data
US 2023/0156963 A1 May 18, 2023

(30) Foreign Application Priority Data
Jan. 25, 2021 (CN) .......................... 202110095495.0

(51) Int. Cl.
*H05K 7/20* (2006.01)

(52) U.S. Cl.
CPC ..... *H05K 7/20327* (2013.01); *H05K 7/20318* (2013.01); *H05K 7/20818* (2013.01); *H05K 7/20836* (2013.01)

(58) Field of Classification Search
CPC .......... H05K 7/20327; H05K 7/20318; H05K 7/20818; H05K 7/20836; H05K 7/20218;
(Continued)

(56) References Cited

U.S. PATENT DOCUMENTS

2007/0045660 A1    3/2007  Yi et al.
2015/0192368 A1*   7/2015  Shedd ................... F25B 41/20
                                                              165/96
(Continued)

FOREIGN PATENT DOCUMENTS

CN    108882657    11/2018
CN    111479441     7/2020
(Continued)

OTHER PUBLICATIONS

CN-111479441-B Translation.*
(Continued)

*Primary Examiner* — Jacob R Crum
*Assistant Examiner* — Matthew Sinclair Muir
(74) *Attorney, Agent, or Firm* — Treasure IP Group, LLC (57) ABSTRACT

The invention provides a two-phase flow active and passive multi-level data center cabinet cooling device and method, wherein the system includes a cabinet cooling device, a condensate system, a waste heat recovery device, a liquid reservoir, a liquid pump, a gas chamber, a fluid working medium, and a corresponding pipeline. The system comprise a closed loop, the loop is filled with nitrogen to maintain a low pressure state, and the pipeline fluid is driven by the liquid pump to flow; the gas chamber maintains a relatively stable air pressure in the two-phase flow loop; the liquid reservoir is connected with the gas chamber, providing an enough gas space to make a phase change occur more easily; the cabinet cooling device can be switched between an active mode and a passive mode to minimize PUE under good heat dissipation capability.

10 Claims, 3 Drawing Sheets

(58) Field of Classification Search
CPC ............. H05K 7/2029; H05K 7/20663; H05K 7/20672; H05K 7/20245; H05K 7/208; H05K 7/20809
See application file for complete search history.

(56) References Cited

U.S. PATENT DOCUMENTS

| | | | | |
|---|---|---|---|---|
| 2016/0174417 | A1* | 6/2016 | Hachiya | H05K 7/208 62/504 |
| 2017/0311485 | A1* | 10/2017 | Yoshikawa | F28D 15/0266 |
| 2023/0225081 | A1* | 7/2023 | Yang | H05K 7/20309 361/679.46 |

FOREIGN PATENT DOCUMENTS

| | | | |
|---|---|---|---|
| CN | 111479441 B | * | 10/2020 |
| CN | 112839490 | | 5/2021 |

OTHER PUBLICATIONS

Exergy Analysis of Pump-driven Two-phase Loop System for Free Cooling in Data Centers. Zhu Wanpeng; Ma Guoyuan; Li, Cuicui; Zhou Feng. Journal of Refrigeration vol. 40, No. 3, Jun. 2019.

\* cited by examiner

TWO-PHASE FLOW ACTIVE AND PASSIVE MULTI-LEVEL DATA CENTER CABINET COOLING DEVICE AND METHOD

CROSS-REFERENCE TO RELATED APPLICATIONS

This Application is a Section 371 National Stage Application No. PCT/CN2021/102365, filed on Jun. 25, 2021, and claims priority to Chinese Patent Application No.202110095495.0, filed on Jan. 25, 2021, the contents of which are incorporated herein by reference in their entireties.

TECHNICAL FIELD

The invention relates to a cooling device and method, in particular to a two-phase flow active and passive multi-level data center cabinet cooling device and method, and belongs to the technical field of equipment room heat dissipation.

BACKGROUND

With the rapid development of cloud computing services, the scale of a data center has gradually increased, and the blade server in the data center cabinet generates more and more heat; in addition, the number of transistors integrated in an electronic device, especially a CPU, has increased dramatically. In order to ensure a normal operation of electronic equipment, the heat needs to be efficiently transmitted out. Therefore, the cooling system of the data center cabinet needs to be updated to meet higher heat dissipation requirements. In addition, the high heat dissipation requirements of the data center cabinet server will also increase the PUE (Power Usage Effectiveness) value. The PUE value refers to the ratio of all the energy consumed by the data center to the energy consumed by the IT load, and has become a relatively common international measurement index for a power usage efficiency of the data center. For the purpose of energy saving, the cooling system of the data center cabinet needs to minimize energy consumption on the premise of meeting heat dissipation requirements.

Currently, there are mainly three data center cooling schemes: air cooling, single-phase liquid cooling, and a combination of these two schemes. Some schemes involve the use of heat pipes. Air cooling is mainly aimed at the heat dissipation of the equipment room of the data center. The air-cooling scheme is mature and consumes less energy, but it is difficult to meet the heat dissipation requirements inside the cabinet. The heat dissipation method combining air cooling and single-phase liquid cooling is also widely used, taking into account the heat dissipation of the equipment room and the heat dissipation of the cabinet, but the two heat dissipation systems need to be separately supplied with energy, thus the energy consumption is high. The single-phase liquid cooling scheme is used less, and due to the lack of equipment room-level air cooling, the heat dissipation effect of the single-phase liquid cooling scheme is not as good as that of the scheme combining air cooling with single-phase liquid cooling. There are also many schemes that apply the existing heat pipe technology and gas-liquid two-phase flow. However, the heat pipe only functions as a heat dissipation component, and the gas-liquid two-phase flow is not the main heat dissipation means for the data center system.

According to the current heat dissipation schemes for data center cabinets, it can be found that the following specific problems exist. Firstly, there is no efficient and energy-saving cooling scheme for cabinet cooling. Two-phase flow cooling can solve this problem, but there is currently no well-formed scheme to support two-phase flow cooling in data centers. Secondly, the level of cooling schemes for data centers is not clear enough at present, and there is no efficient and easy-to-integrate cooling scheme that integrates chip-level cooling, component-level cooling, and system-level cooling. The existing schemes rarely involve chip-level cooling, are not specific and feasible enough, and are not compatible with component-level cooling and system-level cooling. Thirdly, the current cooling schemes mostly involve the conversion of cooling modes so as to achieve the goal of reducing energy consumption by changing the cooling mode according to the cooling requirements, but the cooling mode conversion between air cooling and single-phase liquid cooling is difficult to provide a scheme that combines high cooling performance with energy saving.

The patent with issued number of CN 111479441 B provides a data center cooling system with pump-driven two-phase flow circulation, involves the conversion of two-phase cooling and cooling mode, as well as the heat exchange with the external environment through air cooling, and has efficient cooling performance. However, this patent relates to a gas-liquid separator and a spray device, and has a complex structure and numerous cooling modes, also meaning an increase in energy consumption. In addition, this patent uses two-phase cooling, but there is no application mode conversion of the heat collection module described in this patent, the cooling means at the direct heat source are not improved, and the specific mode conversion effect may be unobvious.

Based on the above description, the current data center cabinets urgently need a cooling system that combines high cooling performance with energy saving, and two-phase flow cooling is an excellent choice worth considering. Moreover, considering that the data center load varies greatly, there is a need for a cooling system that can change the cooling mode according to cooling requirements so as to minimize energy consumption. Of course, this system also requires a high degree of automatic control to reduce the difficulty of application.

SUMMARY OF THE INVENTION

Technical problem: aiming to solve the problems including difficult integration of cooling schemes for data center cabinets, low energy efficiency, and low degree of automation, the invention proposes a two-phase flow active and passive data center cabinet cooling device and method; the cooling mode is adjusted according to the different working conditions of data center cabinets, so as to achieve low energy consumption and automatic control of cooling.

Technical solutions of the present invention are described below.

A two-phase flow active and passive multi-level data center cabinet cooling device is disclosed. In the cooling device, a data center cabinet array comprises a plurality of data center cabinets, each data center cabinet comprises a plurality of blade server motherboards, and a rack-level loop thermosiphon of each blade server motherboard is cascaded and connected to a thermosiphon cooling medium inlet pipeline and thermosiphon cooling medium outlet pipeline; the thermosiphon cooling medium inlet pipeline and the thermosiphon cooling medium outlet pipeline of each cabinet are cascaded and connected with other components through a liquid pipeline; a condensate inlet pipeline and a condensate outlet pipeline of a cabinet condensing unit located on each rack-level loop thermosiphon are cascaded; both the liquid reservoir at the cooling medium inlet and the liquid reservoir at the cooling medium outlet have a gas space, and are interconnected via a gas manifold between the liquid reservoirs and the gas manifold of the cabinet and connected to the gas chamber with a very large gas space and the top of the rack-level loop thermosiphon; the liquid reservoir at the cooling medium inlet is located at a higher position than the rack-level loop thermosiphon, while the liquid reservoir at the cooling medium outlet is located at a lower position than the rack-level loop thermosiphon.

Detail connection method is described below.

The liquid outlet (b) of the liquid reservoir at the cooling fluid inlet is connected to the thermosiphon cooling medium inlet pipeline of the data center cabinet, the thermosiphon cooling medium outlet pipeline is connected to a cooling medium circulating waste heat recovery device and the liquid reservoir at the cooling medium outlet via the liquid pipeline, and is connected to the liquid inlet (f) of the liquid pump circulating the cooling medium, and the liquid outlet (g) of the liquid pump circulating the cooling medium is connected to the liquid inlet (a) of the liquid reservoir at the cooling medium inlet via the liquid pipeline.

The condensate outlet pipeline of the cabinet condensing unit is connected to the condensate water cycle waste heat recovery device through a liquid pipeline, and then connected to the liquid inlet (n) of the liquid pump of the condensate system through the liquid pipeline, and the liquid outlet (m) of the liquid pump of the condensate system is connected to the condensate inlet pipeline of the cabinet condensing unit.

The gas outlet (c) of the liquid reservoir of the cooling medium inlet is connected to the gas inlet (d) of the liquid reservoir at the cooling medium outlet, and the gas outlet (e) of the liquid reservoir of the cooling medium outlet is connected to the gas chamber and the top pipeline (p) of the thermosiphon of the rack-level loop.

Wherein the data center cabinet comprises a plurality of blade server motherboards, and the cooling device of the blade server motherboard comprises a rack-level loop thermosiphon and a blade server condensing unit; the inlet and outlet of each rack-level loop thermosiphon are respectively connected to the thermosiphon cooling medium inlet pipeline and the thermosiphon cooling medium outlet pipeline; the inlet and outlet of each blade server condensing unit are respectively connected to the condensate inlet pipeline and the condensate outlet pipeline.

Further, the connecting pipeline between the blade server condensing unit and the condensate outlet pipeline is provided with a condensing unit temperature sensor and a condensate outlet temperature control valve respectively, and the condensing unit temperature sensor is closer to the blade server condensing unit than the condensate outlet temperature control valve; the condensate inlet temperature control valve is located at the connecting pipeline of the blade server condensing unit and the condensate inlet pipeline; the condensing unit temperature sensor, the condensate inlet temperature control valve and the condensate outlet temperature control valve are connected through a condensing unit wire.

Wherein the connecting pipe line of the rack-level loop thermosiphon and the thermosiphon cooling medium inlet pipeline is provided with a cooling medium inlet temperature control valve; a cooling medium outlet temperature control valve is located at the connecting pipeline of the rack-level loop thermosiphon and the thermosiphon cooling medium outlet pipeline; a gas valve is located at the connecting pipeline of the rack-level loop thermosiphon and the gas manifold of the cabinet; a first CPU temperature sensor and a second CPU temperature sensor are respectively located on a first CPU of the blade server and a second CPU of the blade server on the blade server motherboard; the cooling medium inlet temperature control valve, the cooling medium outlet temperature control valve, the gas valve, the first CPU temperature sensor, and the second CPU temperature sensor are connected by a thermosiphon wire.

Wherein the first CPU of the blade server, the second CPU of the blade server and a thermal interface material are integrated, and a ring structure wrapping a thermosiphon evaporation section pipeline in the thermal interface material wraps the thermosiphon evaporation section pipeline; 4 thermosiphon evaporation section pipelines are connected in parallel and connected with the rack-level loop thermosiphon; the thermal interface material has a fractal tree-like flow channel, two fluid inlets such as a thermal interface material working medium left inlet and a thermal interface material working medium right inlet, and two fluid outlets such as a thermal interface material working medium left outlet and a thermal interface material working medium right outlet; the thermal interface material working medium left inlet and the thermal interface material working medium right inlet are connected to the pipeline of the rack-level loop thermosiphon on the left side of the thermosiphon evaporation section pipeline via a thermal interface material working medium inlet pipeline; the thermal interface material working medium left outlet and the thermal interface material working medium right outlet are connected to the pipeline of the rack-level loop thermosiphon on the right side of the thermosiphon evaporation section pipeline via a thermal interface material working medium outlet pipeline.

Wherein the thermal interface material contains two upper and lower layers of fractal tree-like flow channels, and the two layers of fractal tree-like flow channels are connected by a connecting pipeline of the upper and lower layers of the fractal tree-like flow channels located at the tail end of the fractal tree-like flow channel; the fractal tree-like flow channel contains multiple micro-cells, the ring structure that wraps the thermosiphon evaporation section pipeline is etched with multiple flow channels in the ring structure of the thermal interface material, and the micro-cells are connected with the flow channels in the ring structure of the thermal interface material one by one.

Wherein the liquid reservoir at the cooling medium inlet, the rack-level loop thermosiphon, the cooling medium circulating waste heat recovery device, the liquid reservoir at the cooling medium outlet, and the liquid pump circulating the cooling medium form a closed circulation structure; the cooling medium works at low air pressure, and distilled water is used as the working medium; the closed circulation structure is evacuated and then filled with a small amount of nitrogen, so that the system works at 0.1 atmospheric pressure finally after injecting the working medium; the cabinet condensing unit, the condensate circulating waste heat recovery device, and the liquid pump of the condensate system form a closed circulation structure; the closed circulation structure uses water as the cooling medium and works at normal pressure; the condensate temperature is monitored by the condensing unit temperature sensor; the CPU junction temperature is monitored by the first CPU temperature sensor and the second CPU temperature sensor.

Wherein when the condensate temperature monitored by the condensing unit temperature sensor is lower than the high temperature threshold of the condensate, the condensate inlet temperature control valve and the condensate outlet temperature control valve are both closed, and the liquid pump of the condensate system is closed; when the condensate temperature monitored by the condensing unit temperature sensor is higher than the high temperature threshold of the condensate, the condensing unit temperature sensor sends a signal to open the condensate inlet temperature control valve and the condensate outlet temperature control valve and start the liquid pump of the condensate system to continuously inject condensate into the cabinet condensing unit; when the condensate temperature monitored by the condensing unit temperature sensor is lower than the low temperature threshold of the condensate, and the condensate inlet temperature control valve, the condensate outlet temperature control valve and the liquid pump of the condensate system are all in the open state, the condensing unit temperature sensor sends a signal, the liquid pump of the condensate system is closed, and then the condensate inlet temperature control valve and the condensate outlet temperature control valve are also closed one after another.

Wherein when the CPU junction temperature monitored by the first CPU temperature sensor and the second CPU temperature sensor is lower than the CPU high temperature threshold, the cooling medium inlet temperature control valve, the cooling medium outlet temperature control valve and the gas valve are all closed, and the rack-level loop thermosiphon performs passive two-phase flow cooling; when the CPU junction temperature monitored by the first CPU temperature sensor or the second CPU temperature sensor is higher than the CPU high temperature threshold, the sensor that exceeds the threshold temperature sends a signal, the cooling medium inlet temperature control valve and the cooling medium outlet temperature control valve are opened, the gas valve is kept closed, the working medium in the liquid reservoir at a high position and the cooling medium inlet flows to the rack-level loop thermosiphon, and to the liquid reservoir at a low position and the cooling medium outlet through a pipeline, and the rack-level loop thermosiphon begins to perform active two-phase flow cooling; when the CPU junction temperature monitored by the first CPU temperature sensor and the second CPU temperature sensor is lower than the CPU low load threshold temperature, and the cooling medium inlet temperature control valve and the cooling medium outlet temperature control valve are opened, the first CPU temperature sensor and the second CPU temperature sensor send a signal, the cooling medium inlet temperature control valve is closed, the gas valve is opened, the working medium in the top pipeline of the rack-level loop thermosiphon flows to the low-position liquid reservoir at the cooling medium outlet, then the cooling medium outlet temperature control valve and the gas valve are closed, and the rack-level loop thermosiphon returns to the passive two-phase flow cooling mode.

Wherein the working medium in the pipeline on the left side of the rack-level loop thermosiphon flows into the fractal tree-like flow channel in the thermal interface material through the thermal interface material working medium inlet pipeline, and flows out to the pipeline on the right side of the rack-level loop thermosiphon via the thermal interface material working medium outlet pipeline; the micro-cell and the flow channel in the ring structure of the thermal interface material form a micro thermosiphon.

Beneficial effects: the invention has the following advantages.

Firstly, the invention provides a complete set of implementation scheme for two-phase flow cooling and has a better cooling effect than traditional liquid cooling and air cooling.

Secondly, the invention designs a multi-level cooling structure and an automatic control scheme, solving the problem that the current data center cooling system has a low degree of integration and is difficult to realize automatic control.

Thirdly, according to the load of the data center cabinet, the invention designs two different cooling modes such as active and passive two-phase flow cooling modes, and the cooling system only needs to provide the electric energy to drive the liquid pump and the sensor, ensuring that the PUE of the data center is as low as possible on the basis of ensuring a good cooling effect.

Fourthly, the invention combines and improves the microchannel cooling technology, so that the heat generated by a chip enters the cooling system more efficiently.

The drawings include:
a data center cabinet array 1,
data center cabinets 2,
a cabinet condensing unit 3,
the liquid pump 4 circulating the cooling medium,
the liquid pump 5 of the condensate system,
the liquid reservoir 6 at the cooling medium inlet,
the liquid reservoir 7 at the cooling medium outlet,
condensate circulating waste heat recovery device 8-1,
the cooling medium circulating waste heat recovery device 8-2,
gas manifold 9-1 between the liquid reservoirs,
gas manifold 9-2 of the cabinet,
the gas chamber 10,
the rack-level loop thermosiphon 11,
a thermosiphon cooling medium inlet pipeline 12,
the thermosiphon cooling medium outlet pipeline 13,
the condensate inlet pipeline 14,
the condensate outlet pipeline 15,
cabinet shell 16,
blade server motherboard 17,
the blade server condensing unit 18,
a cooling medium inlet temperature control valve 19,
the cooling medium outlet temperature control valve 20,
the gas valve 21,
the condensing unit temperature sensor 22,
the condensate inlet temperature control valve 23,
the condensate outlet temperature control valve 24,
a condensing unit wire 25-1,
the thermosiphon wire 25-2, the first CPU 26-1 of the blade server,
the second CPU 26-2 of the blade server,
a first CPU temperature sensor 27-1,
a second CPU temperature sensor 27-2,
the thermosiphon evaporation section pipeline 28,
the thermal interface material 29,
a thermal interface material working medium inlet pipeline 30,
a thermal interface material working medium outlet pipeline 31,
the ring structure 32 that wraps the thermosiphon evaporation section pipeline
a thermal interface material working medium left inlet 33-1,
a thermal interface material working medium right inlet 33-2,
the thermal interface material working medium left outlet 34-1,
the thermal interface material working medium right outlet 34-2,
the fractal tree-like flow channel 35,
micro-cells 36,
the flow channels 37 in the ring structure of the thermal interface material,
a connecting pipeline (38) of the upper and lower layers of the fractal tree-like flow channels,
the liquid inlet (a) of the liquid reservoir at the cooling medium inlet,
the liquid outlet (b) of the liquid reservoir at the cooling medium inlet,
the gas outlet (c) of the liquid reservoir at the cooling medium inlet,
the gas inlet (d) of the liquid reservoir at the cooling medium outlet,
the gas outlet (e) of the liquid reservoir at the cooling medium outlet,
the liquid inlet (f) of the liquid pump circulating the cooling medium,
the liquid outlet (g) of the liquid pump circulating the cooling medium,
the liquid outlet (m) of the liquid pump of the condensate system,
the liquid inlet (n) of the liquid pump of the condensate system, and
the top pipeline (p) of the thermosiphon of the rack-level loop.

DETAILED EMBODIMENTS

The invention A two-phase flow active and passive multi-level data center cabinet cooling device, wherein in the cooling device, a data center cabinet array 1 comprises a plurality of data center cabinets 2, each data center cabinet 2 comprises a plurality of blade server motherboards 17, and a rack-level loop thermosiphon 11 of each blade server motherboard 17 is cascaded and connected to a thermosiphon cooling medium inlet pipeline 12 and a thermosiphon cooling medium outlet pipeline 13; the thermosiphon cooling medium inlet pipeline 12 and the thermosiphon cooling medium outlet pipeline 13 of each cabinet are cascaded and connected with other components through a liquid pipeline; a condensate inlet pipeline 14 and a condensate outlet pipeline 15 of a cabinet condensing unit 3 located on each rack-level loop thermosiphon 11 are cascaded; both the liquid reservoir 6 at the cooling medium inlet and the liquid reservoir 7 at the cooling medium outlet have a gas space, and are interconnected via a gas manifold 9-1 between the liquid reservoirs and the gas manifold 9-2 of the cabinet and connected to the gas chamber 10 with a very large gas space and the top of the rack-level loop thermosiphon 11; the liquid reservoir 6 at the cooling medium inlet is located at a higher position than the rack-level loop thermosiphon 11, while the liquid reservoir 7 at the cooling medium outlet is located at a lower position than the rack-level loop thermosiphon 11.

The specific connection method is the following.

the liquid outlet b of the liquid reservoir at the cooling fluid inlet is connected to the thermosiphon cooling medium inlet pipeline 12 of the data center cabinet 2, the thermosiphon cooling medium outlet pipeline 13 is connected to a cooling medium circulating waste heat recovery device 8-2 and the liquid reservoir 7 at the cooling medium outlet via the liquid pipeline, and is connected to the liquid inlet f of the liquid pump circulating the cooling medium, and the liquid outlet g of the liquid pump circulating the cooling medium is connected to the liquid inlet a of the liquid reservoir at the cooling medium inlet via the liquid pipeline.

The condensate outlet pipeline 15 of the cabinet condensing unit 3 is connected to the condensate circulating waste heat recovery device 8-1 through the liquid pipeline, and then is connected to the liquid inlet n of the liquid pump of the condensate system through the liquid pipeline, and the liquid outlet m of the liquid pump of the condensate system is connected to the condensate inlet pipeline 14 of the cabinet condensing unit 3.

The gas outlet c of the liquid reservoir at the cooling medium inlet is connected to the gas inlet d of the liquid reservoir at the cooling medium outlet, and the gas outlet e of the liquid reservoir at the cooling medium outlet is connected to the gas chamber 10 and the top pipeline p of the thermosiphon of the rack-level loop The invention uses a multi-level cooling structure, including chip level, component level and system level.

Chip-level cooling scheme: The dual CPU chip of a blade server is integrated with a thermal interface material (TIM); the thermal interface material uses diamond with high thermal conductivity as the construction material; and a fluid channel is etched inside the diamond, and the channel body uses a fractal tree structure, so that the heat can be evenly distributed in the thermal interface material layer; in addition, the thermal interface material adds numerous micro-cells at the tail end of the fractal tree structure so as to form a micro-loop thermosiphon with the channel of the ring structure above; the ring channel is etched in the ring structure in the upper part of the thermal interface material, and the structure wraps the evaporation section of the rack-level loop thermosiphon; the ring structure is bonded with the loop thermosiphon using thermally conductive silicone grease, so that the heat can be transferred to the fluid working medium more efficiently; the channel inlet in the thermal interface material is connected to the inlet flow channel of the evaporation section of the loop thermosiphon through a conduit, and the outlet is also connected to the outlet of the evaporation section of the thermosiphon.

Component-level cooling scheme: The main body of component-level cooling is the rack-level loop thermosiphon, and also includes a condensing unit, a temperature sensor and a temperature control valve. As described in the chip-level cooling scheme, the evaporation section of the rack-level loop thermosiphon is bonded with the thermal interface material, and heat dissipation is achieved by directly cooling the thermal interface material; the condensing section of the loop thermosiphon is immersed in the condensing unit, and the low-temperature water in the condensing unit is used as a cooling medium, so that the temperature of the working medium at the inlet of the evaporation section of the thermosiphon is reduced, and then the thermosiphon has a better continuous heat dissipation effect; the temperature sensor obtains the CPU chip junction temperature and the condensate outlet temperature in a working state, and the temperature control valve automatically controls the working mode of the thermosiphon and the working mode of the condensing unit according to the temperature change.

System-level cooling scheme: The system-level cooling scheme is connected to multiple rack-level loop thermosiphons in a cabinet in parallel, and the cooling system between multiple cabinets in the equipment room can also be connected in parallel to form the main body of the cooling system. In addition, the components included are a liquid pump, a liquid reservoir, a waste heat recovery device, a gas chamber, a corresponding gas manifold and valve. The liquid pump drives the working medium and the condensing system to circulate; the liquid reservoir stores liquid and reserves a gas space, and the gas space is connected to the gas chamber, so that the phase change of the liquid working medium will not cause a drastic change in the pressure; the waste heat recovery device recovers the waste heat in the cooling working medium and the condensate, so that the temperature of the working medium and condensate at the inlet is maintained at a relatively low temperature; the gas manifold is connected to the gas part of the two liquid reservoirs and the top of the rack-level loop thermosiphon, so that the air pressure of each part of the system is balanced, and the liquid flows under the action of gravity when the gas valve is opened. Moreover, the condensing unit of each rack-level loop thermosiphon is connected in parallel, the waste heat is recovered by the waste heat recovery device, and the liquid is pumped by the liquid pump to the inlet end.

The system is composed of two closed circulations, including a cooling medium circulation and a condensate circulation. The main cooling medium works at low air pressure, and distilled water is used as the working medium; the closed system is evacuated and then filled with a small amount of nitrogen, so that the system works at 0.1 atmospheric pressure finally. The condensate circulation structure uses water as the cooling medium and works at normal pressure.

As the heat load of the data center changes, the system can use two working modes such as active and passive two-phase flow modes.

Passive two-phase flow: When the data center cabinet runs at low load, all temperature control valves and gas valves are closed, and the system performs a passive two-phase flow cooling mode relying on the rack-level loop thermosiphon. The liquid working fluid undergoes a phase change in the evaporation section of the thermosiphon and the thermal interface material, so that a two-phase flow appears at the outlet of the evaporation section, and its density is lower than that of the single-phase flow at the inlet; then the pressure at the inlet end is higher than that at the outlet end, the working medium flows under this pressure difference, and the thermosiphon works in the passive two-phase flow cooling mode.

Active two-phase flow: The temperature sensor obtains the chip junction temperature of the blade server CPU; when the data center cabinet runs at high load and the chip junction temperature exceeds the dangerous threshold, the temperature control valves at the inlet and outlet of the thermosiphon are opened, and the liquid working medium in the liquid reservoir at a high position flows to the thermosiphon due to the action of gravity; after passing through the loop, the liquid working medium flows out from the outlet valve, and flows into the liquid reservoir at a low position through the waste heat recovery device. In this case, the system works in an active mobile phase change cooling mode. It should be noted that when the liquid in the liquid reservoir at the low position is accumulated to a certain extent, the liquid pump is started to pump the liquid to the liquid reservoir at the high position.

When the system works in a low load state, the overall cooling device uses the passive two-phase flow cooling mode; when the system changes from the low load state to a high load state, the overall cooling device changes to the active two-phase flow cooling mode; when the system changes from the high load state to the low load state, the overall cooling device returns to the passive two-phase flow cooling mode.

The liquid circulation of the condensate system is independent of the above-mentioned working mode conversion process, and the temperature sensor obtains the temperature at the outlet of the condensing unit; when the temperature exceeds the threshold, the temperature control valves at the inlet and outlet of the condenser are opened, and the liquid pump is started to inject condensate into the corresponding condensing unit; when the temperature at the outlet is lower than a certain threshold, the liquid pump is closed, then the two temperature control valves are closed, and the condensing unit exchanges heat with the top pipe of the thermosiphon again in the case of being enclosed.

The cooling system and the control method thereof have the following characteristics:

1. A multi-level cooling structure; clear levels including chip level, component level and system level; easy integration.
2. Adoption of a two-phase flow cooling mode, achieving a higher heat transfer coefficient and heat dissipation effect.
3. The cooling system adjusts the working mode according to different heat dissipation requirements of the data center to maintain a large energy efficiency ratio.
4. The use of temperature sensors and temperature control valves to achieve system mode conversion and a high degree of automatic control.
5. The gas chamber maintains a stable air pressure in the closed system, and gas can assist in the automatic control of the system.
6. The use of micro-flow channels and micro-cells combined with improvement to achieve a more significant heat dissipation effect at the chip.

According to the drawings, the invention is further described as follows.

Figure 1:
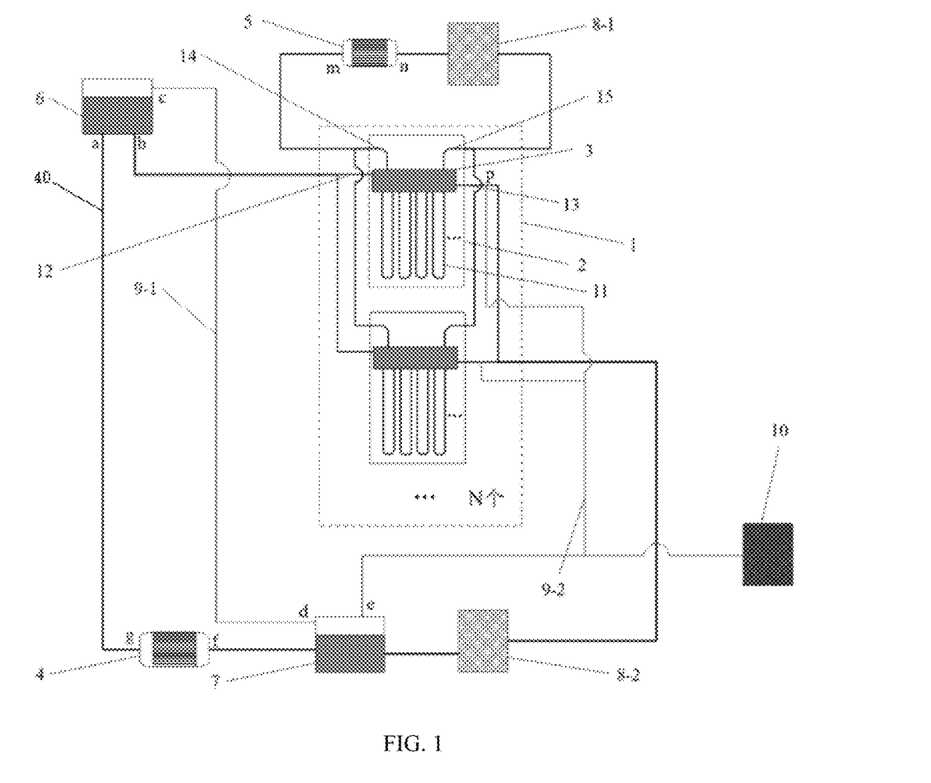
FIG. 1 is the schematic diagram of the system structure of the invention.

As shown in FIG. 1, the liquid pump 5 of the condensate system, the waste heat recovery device 8-1 and the cabinet condensing unit 3 form the condensate system; the rack-level loop thermosiphon 11 in the cabinet array 1 of the data center equipment room, the liquid pump 4 for circulating the cooling working medium, the liquid reservoir 6 at the cooling working medium inlet, the liquid reservoir 7 at the cooling working medium outlet, the cooling working medium circulating waste heat recovery device 8-2, the gas manifold 9-1 between the liquid reservoirs, the gas manifold (9-2) of the cabinet, and the gas chamber 10 form the cabinet cooling device. The cabinet cooling device forms a closed loop and works at 0.1 atmospheric pressure, where the liquid working medium is distilled water (the boiling point of water at 0.1 atmospheric pressure is about 46° C., meeting the working conditions of two-phase flow). When the heat load of the data center is small, the rack-level loop thermosiphon 11 is in passive cooling mode, the cabinet cooling device does not work, there is no energy consumption, and only the condensate system works. When the heat load of the data center is large, the rack-level loop thermosiphon 11 is in an active cooling mode and becomes a fluid pipeline in the active cooling mode, and the liquid reservoir 6 at the cooling medium inlet is located at a high position and injects the liquid working medium into the rack-level loop thermosiphon 11, while the outlet working medium enters the cooling working medium circulating waste heat recovery device 8-2 to recover the waste heat, and then enters the liquid reservoir 7 at the cooling working medium outlet. When the liquid working medium in the liquid reservoir 6 at the cooling medium inlet is too little, the liquid pump 5 of the condensate system is started, and the liquid in the liquid reservoir 7 at the cooling medium outlet is pumped to the liquid reservoir 6 at the cooling medium inlet. It is worth noting that the gas parts of the two liquid reservoirs are connected to each other through the gas manifold 9-1 between the liquid reservoirs, and are connected to the gas chamber 10 and the condensing section of the rack-level loop thermosiphon 11 through the gas manifold 9-2 of the cabinet, ensuring that the air pressure of the two liquid reservoirs is balanced and also achieving favorable liquid exchange between the two; moreover, due to the large space of the gas chamber 10, the air pressure will not change drastically.

Figure 2:
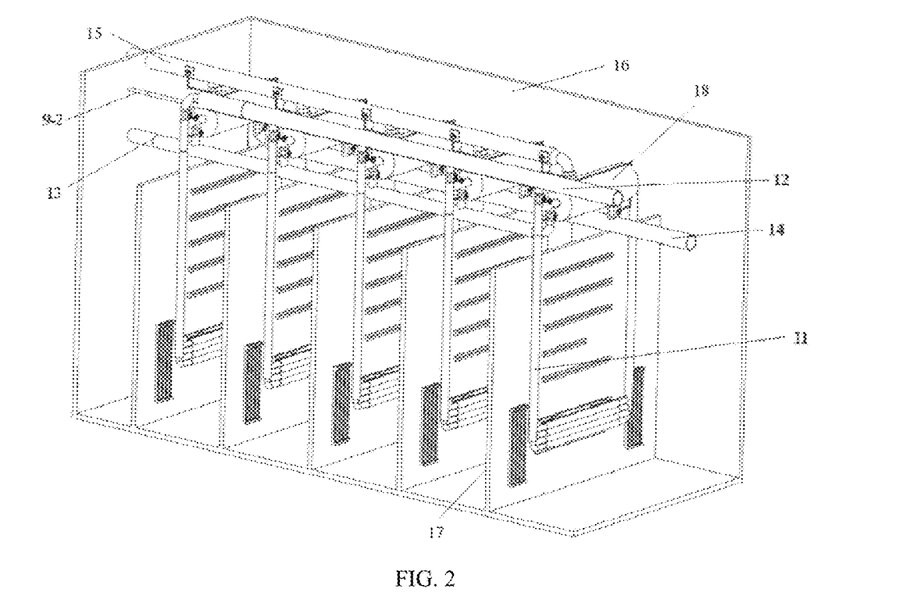
FIG. 2 is the internal schematic diagram of the cabinet cooling system.
Figure 3:
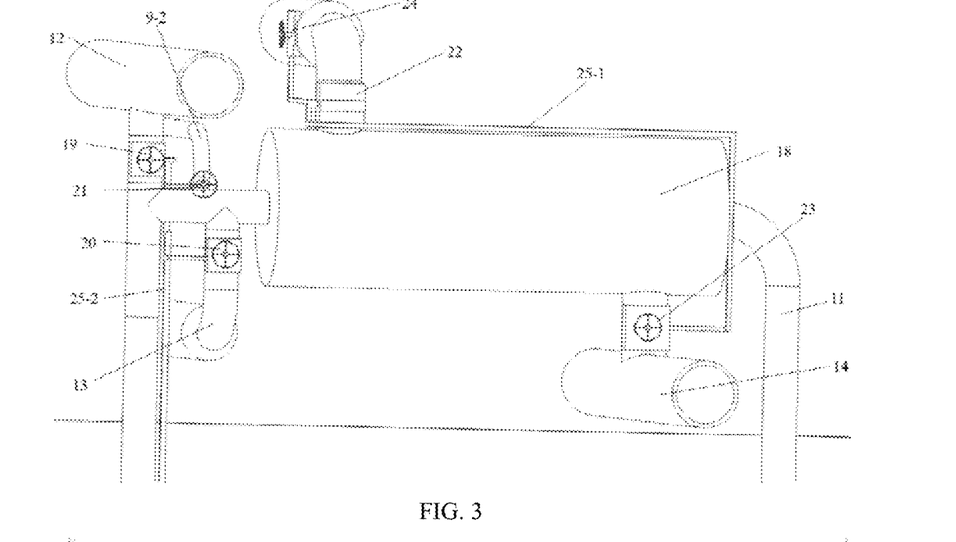
FIG. 3 is the top structure diagram of the cooling system of a single blade server.
Figure 4:
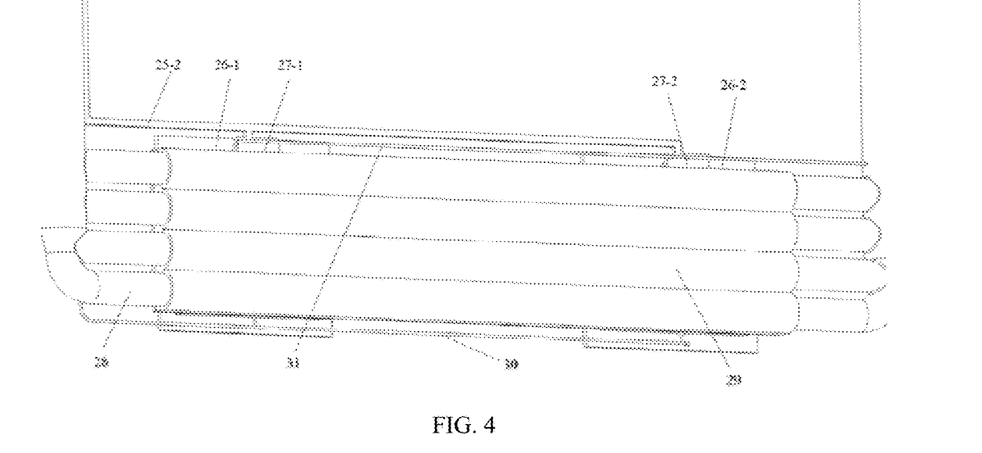
FIG. 4 is the structure diagram of the heat source of the cooling system of a single blade server.
Figure 5:
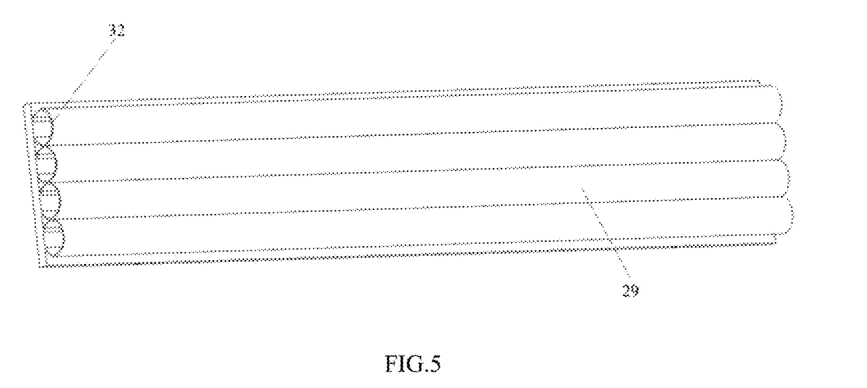
FIG. 5 is the schematic diagram of a thermal interface material.

As shown in FIGS. 2 and 3, 18 is a blade server condensing unit, which cools the top of the rack-level loop thermosiphon 11 and maintains the working medium at the inlet of the evaporation section of the rack-level loop thermosiphon 11 at a low temperature; the temperature control valve 19 at the inlet of the cooling medium controls the inlet of the rack-level loop thermosiphon, and the temperature control valve 20 at the outlet of the cooling medium controls the outlet of the rack-level loop thermosiphon 11, while the gas valve 21 controls the connection between the rack-level loop thermosiphon 11 and the gas manifold 9-2 of the cabinet in FIG. 2. When the rack-level loop thermosiphon 11 is in the passive cooling mode, the temperature control valve 19 at the cooling medium inlet, the temperature control valve 20 at the cooling medium outlet, and the gas valve 21 are all closed; when the rack-level loop thermosiphon 11 enters the active cooling mode, the temperature control valve 19 at the cooling medium inlet and the temperature control valve 20 at the cooling medium outlet are opened; in this case, since the gas part of the liquid reservoir 6 at the inlet of the cooling medium and the gas part of the liquid reservoir 7 at the outlet of the cooling medium in FIG. 1 are connected to the rack-level loop thermosiphon 11, the air pressure is balanced; moreover, the working medium in the liquid reservoir 6 at the cooling medium inlet automatically flows into the rack-level loop thermosiphon 11 due to gravity, and the rack-level loop thermosiphon 11 enters the active two-phase flow cooling mode; when the rack-level loop thermosiphon 11 enters the passive cooling mode again, the temperature control valve 19 at the inlet of the cooling medium is closed, and the gas valve 21 is opened; in this case, the gas manifold 9-2 of the cabinet is connected to the top pipeline of the rack-level loop thermosiphon 11 and the gas part of the liquid reservoir 7 at the outlet of the cooling medium, and the air pressure is balanced; moreover, the working medium in the top pipeline of the rack-level loop thermosiphon 11 will flow to the liquid reservoir 7 at the outlet of the cooling medium due to gravity so as to complete the cooling mode conversion, then the temperature control valve 20 at the outlet of the cooling medium and the gas valve 21 are closed, and the system enters the passive cooling mode. The condensing unit temperature sensor 22 monitors the outlet temperature of the condensing unit, and the condensate inlet temperature control valve 23 and the condensate outlet temperature control valve 24 respectively control the inlet and outlet of the condensing unit branch. When the condensing unit temperature sensor 22 monitors that the temperature rises to a certain threshold, the condensing unit temperature sensor 22 sends a signal to the condensate inlet temperature control valve 23 and the condensate outlet temperature control valve 24 through a condensing unit wire 25-1, the condensate inlet temperature control valve 23 and the condensate outlet temperature control valve 24 are opened, and the liquid pump 4 circulating the cooling medium in FIG. 4 is started to inject condensate into the blade server condensing unit 18. When the temperature drops to a certain threshold and the condensate inlet temperature control valve 23 and the condensate outlet temperature control valve 24 are opened, the liquid pump 4 circulating the cooling medium is closed, the condensate inlet temperature control valve 23 and the condensate outlet temperature control valve 24 are then closed, and the blade server condensing unit 14 performs heat exchange with the top pipeline of the rack-level loop thermosiphon 11 again in the case of being enclosed.

As shown in FIG. 4 and FIGS. 5, 26-1 and 26-2 are the first CPU of the blade server and the second CPU of the blade server, respectively, and are also the heat source of the cooling system; the first CPU temperature sensor 27-1 and the second CPU temperature sensor 27-2 respectively monitor the chip junction temperature of the first CPU 26-1 of the blade server and the second CPU 26-2 of the blade server, and are connected with the temperature control valve 19 at the cooling medium inlet, the temperature control valve 20 at the cooling medium outlet and the gas valve 21 in FIG. 3 through a wire 26-2. When the junction temperature of one of the CPU chips exceeds the dangerous threshold, the first CPU temperature sensor 27-1 and the second CPU temperature sensor 27-2 send a signal to the temperature control valve 19 at the cooling medium inlet, the temperature control valve 20 at the working medium outlet and the gas valve 21 through the thermosiphon wire 25-2 so as to control the rack-level loop thermosiphon 11 to enter the active two-phase flow cooling mode. When the junction temperature of both CPU chips is lower than a certain threshold, and the temperature control valve 19 at the cooling medium inlet and the temperature control valve 20 at the cooling medium outlet are opened, the first CPU temperature sensor 27-1 and the second CPU temperature sensor 27-2 send a signal through the thermosiphon wire 25-2 to the temperature control valve 19 at the cooling medium inlet, the temperature control valve 20 at the cooling medium outlet and the gas valve 21, so that the rack-level loop thermosiphon 11 enters the passive two-phase cooling mode again. The specific control mode is described above. 28 is the pipeline of the evaporation section of the thermosiphon; in order to increase the heat exchange area, the evaporation section is divided into four pipelines. 29 is the thermal interface material, which is integrated with the first CPU 26-1 of the blade server and the second CPU 26-2 of the blade server, and directly exchanges heat with the chip. In addition, the thermal interface material is diamond, and there is a micro-flow channel etched inside the material. The micro-flow channel is connected to the rack-level loop thermosiphon 11 through the thermal interface material working medium inlet pipeline 30 and the thermal interface material working medium outlet pipeline 31, and exchanges heat with the thermosiphon. Moreover, the ring structure of the thermal interface material 29 wraps the thermosiphon evaporation section pipeline 28, so that the heat is more evenly conducted to the rack-level loop thermosiphon 11. The four ring structures 32 wrapping the evaporation section of the thermosiphon respectively wrap the pipeline 28 of the evaporation section of the loop thermosiphon shown in FIG. 4, and the two are bonded with thermally conductive silicone grease to make the thermal resistance smaller. The inside of the ring structure 32 wrapping the evaporation section of the thermosiphon is also etched with a flow channel, so that the heat is evenly conducted on the thermal interface material.

Figure 6:
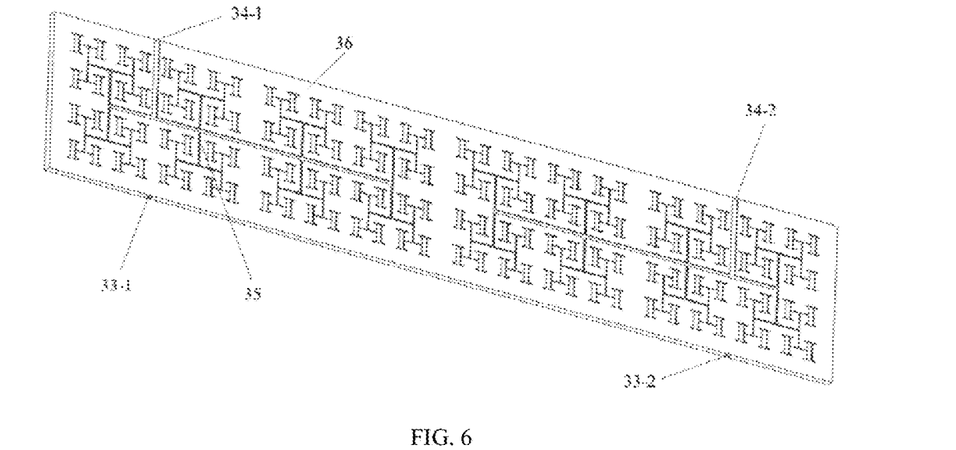
FIG. 6 shows the fractal tree-like flow channel of the thermal interface material.
Figure 7:
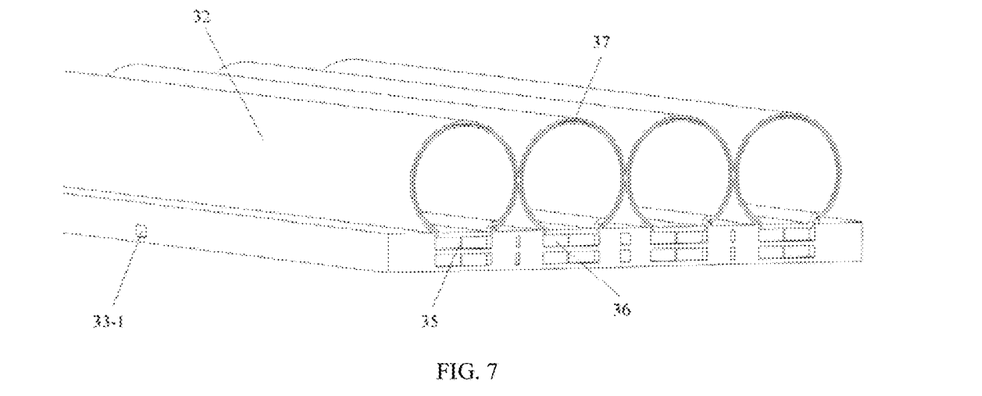
FIG. 7 shows the flow channel in the ring structure.
Figure 8:
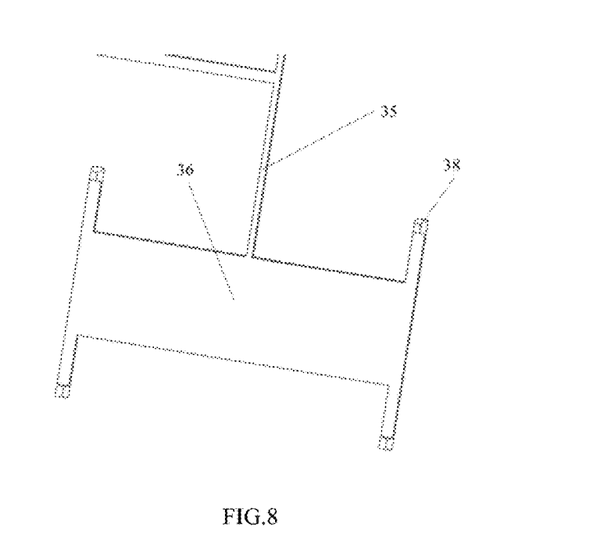
FIG. 8 is the detailed drawing of the fractal tree-like flow channel.

As shown in FIG. 6, FIG. 7 and FIG. 8, the internal flow channel of the thermal interface material uses the upper and lower double-layer fractal tree-like flow channel 35. The flow channel shown in the figure is the upper-layer flow channel. The thermal interface material working medium left inlet 33-1 and the thermal interface material working medium right inlet 33-2 are connected to the lower-layer fractal tree structure, while the thermal interface material working medium left outlet 34-1 and the thermal interface material working medium right outlet 34-2 are connected to the upper-layer fractal tree structure. The upper and lower layers of flow channels have the same structure except for different inlet and outlet directions. The two layers of flow channels are connected by the upper and lower layers of connecting pipelines 38 of the fractal tree-shaped flow channel in FIG. 8. The fractal tree-like flow channel 35 is divided into two independent fractal trees. The left side of the left fractal tree and the right side of the right fractal tree are directly above the first CPU 26-1 of the blade server and the second CPU 26-2 of the blade server, respectively. In order to uniformly conduct heat in the thermal interface material, the two fractal trees are respectively extended to the central area of the thermal interface material 29. The thermal interface material 29 also contains a large number of micro-cell structures, namely the micro-cell 36, which increases the mass of the fractal tree working medium and is also connected to the flow channel 37 in the ring structure of the thermal interface material in FIG. 7. The thickness of the flow channel 37 in the ring structure of the thermal interface material is very small, the internal working medium is in a thin film state, and the evaporation efficiency is high, making for heat exchange.

The invention claimed is:

1. A two-phase flow active and passive multi-level data center cabinet cooling device, wherein
in the cooling device, comprising
a data center cabinet array (1) comprises a plurality of data center cabinets (2),
each data center cabinet (2) comprises a plurality of blade server motherboards (17), and a rack-level loop thermosiphon (11) of each blade server motherboard (17) is cascaded and connected to a thermosiphon cooling medium inlet pipeline (12) and a thermosiphon cooling medium outlet pipeline (13);
the thermosiphon cooling medium inlet pipeline (12) and the thermosiphon cooling medium outlet pipeline (13) of each data center cabinet are cascaded and connected with other components through a liquid pipeline;
a condensate inlet pipeline (14) and a condensate outlet pipeline (15) of a cabinet condensing unit (3) located on each rack-level loop thermosiphon (11) are cascaded;
both a liquid reservoir (6) of cooling medium inlet and a liquid reservoir (7) of a cooling medium outlet have a first gas space, and are interconnected via a first gas manifold (9-1) between the liquid reservoirs; and a second gas manifold (9-2) of the data center cabinet is connected to a gas chamber (10) with a second gas space and a top of the rack-level loop thermosiphon (11);
the liquid reservoir (6) of the cooling medium inlet is located at a higher position than the rack-level loop thermosiphon (11), while the liquid reservoir (7) of the cooling medium outlet is located at a lower position than the rack-level loop thermosiphon (11); wherein
a liquid outlet (b) of the liquid reservoir of the cooling medium inlet is connected to the thermosiphon cooling medium inlet pipeline (12) of the data center cabinet (2), the thermosiphon cooling medium outlet pipeline (13) connects a cooling medium circulating waste heat recovery device (8-2) and the liquid reservoir (7) of the cooling medium outlet via the liquid pipeline, and is connected to a liquid inlet (f) of a liquid pump circulating a cooling medium, and a liquid outlet (g) of the liquid pump circulating the cooling medium is connected to a liquid inlet (a) of the liquid reservoir of the cooling medium inlet via the liquid pipeline;
the condensate outlet pipeline (15) of the cabinet condensing unit (3) connects a condensate circulating waste heat recovery device (8-1) through the liquid pipeline, and then is connected to a liquid inlet (n) of a liquid pump of a condensate system through the liquid pipeline, and a liquid outlet (m) of the liquid pump of the condensate system is connected to the condensate inlet pipeline (14) of the cabinet condensing unit (3);
a gas outlet (c) of the liquid reservoir of the cooling medium inlet is connected to a gas inlet (d) of the liquid reservoir of the cooling medium outlet, and a gas outlet (e) of the liquid reservoir of the cooling medium outlet is connected to the gas chamber (10) and a top pipeline (p) of the rack-level loop thermosiphon.

2. The two-phase flow active and passive multi-level data center cabinet cooling device according to claim 1, wherein the data center cabinet (2) comprises
the plurality of blade server motherboards (17), and the cooling device of the plurality of blade server motherboards (17) comprise the rack-level loop thermosiphon (11) and a blade server condensing unit (18);
an inlet and an outlet of each rack-level loop thermosiphon (11) are respectively connected to the thermosiphon cooling medium inlet pipeline (12) and the thermosiphon cooling medium outlet pipeline (13); and
an inlet and an outlet of each blade server condensing unit (18) are respectively connected to the condensate inlet pipeline (14) and the condensate outlet pipeline (15).

3. The two-phase flow active and passive multi-level data center cabinet cooling device according to claim 2, wherein a connecting pipeline of the blade server condensing unit (18) and the condensate outlet pipeline (15) is provided with a condensing unit temperature sensor (22) and a condensate outlet temperature control valve (24) respectively, and the condensing unit temperature sensor (22) is closer to the blade server condensing unit (18) than the condensate outlet temperature control valve (24);
a condensate inlet temperature control valve (23) is located at the connecting pipeline of the blade server condensing unit (18) and the condensate inlet pipeline (14);

the condensing unit temperature sensor (22), the condensate inlet temperature control valve (23) and the condensate outlet temperature control valve (24) are connected through a condensing unit wire (25-1).

4. The two-phase flow active and passive multi-level data center cabinet cooling device according to claim 2, wherein
a connecting pipe line of the rack-level loop thermosiphon (11) and the thermosiphon cooling medium inlet pipeline (12) is provided with a cooling medium inlet temperature control valve (19);
a cooling medium outlet temperature control valve (20) is located at the connecting pipeline of the rack-level loop thermosiphon (11) and the thermosiphon cooling medium outlet pipeline (13);
a gas valve (21) is located at the connecting pipeline of the rack-level loop thermosiphon (11) and the second gas manifold (9-2) of the cabinet;
a first CPU temperature sensor (27-1) and a second CPU temperature sensor (27-2) are respectively located on a first CPU (26-1) of the blade server and a second CPU (26-2) of the blade server on the blade server motherboard;
the cooling medium inlet temperature control valve (19), the cooling medium outlet temperature control valve (20), the gas valve (21), the first CPU temperature sensor (27-1), and the second CPU temperature sensor (27-2) are connected by a thermosiphon wire (25-2).

5. The two-phase flow active and passive multi-level data center cabinet cooling device according to claim 4, wherein
the first CPU (26-1) of the blade server, the second CPU (26-2) of the blade server and a thermal interface material (29) are integrated, and a ring structure (32) wrapping a thermosiphon evaporation section pipeline in the thermal interface material (29) wraps the thermosiphon evaporation section pipeline (28);
4 thermosiphon evaporation section pipelines (28) are connected in parallel and connected with the rack-level loop thermosiphon (11);
the thermal interface material (29) has a fractal tree-like flow channel (35), two fluid inlets a thermal interface material cooling medium left inlet (33-1) and a thermal interface material cooling medium right inlet (33-2), and two fluid outlets such as a thermal interface material cooling medium left outlet (34-1) and a thermal interface material cooling medium right outlet (34-2);
the thermal interface material cooling medium left inlet (33-1) and the thermal interface material cooling medium right inlet (33-2) are connected to the pipeline of the rack-level loop thermosiphon (11) on a left side of the thermosiphon evaporation section pipeline (28) via a thermal interface material cooling medium inlet pipeline (30);
the thermal interface material cooling medium left outlet (34-1) and the thermal interface material cooling medium right outlet (34-2) are connected to the pipeline of the rack-level loop thermosiphon (11) on a right side of the thermosiphon evaporation section pipeline (28) via a thermal interface material cooling medium outlet pipeline (31).

6. The two-phase flow active and passive multi-level data center cabinet cooling device according to claim 1, wherein a thermal interface material (29) comprises two, upper and lower, layers of fractal tree-like flow channels (35), and the two layers of fractal tree-like flow channels (35) are connected by a connecting pipeline (38) of the upper and lower layers of the fractal tree-like flow channels located at a tail end of the fractal tree-like flow channels (35);
the fractal tree-like flow channels (35) contain multiple micro-cells (36), a ring structure (32) of the thermal interface material wraps a thermosiphon evaporation section pipeline and is etched with multiple flow channels (37), and the micro-cells (36) are connected with the flow channels (37) in the ring structure of the thermal interface material.

7. A heat dissipation method for the two-phase flow active and passive multi-level data center cabinet cooling device, comprising
providing the two-phase flow active and passive multi-level data center cabinet cooling device according to claim 1,
forming a first closed circulation structure by the liquid reservoir (6) of the cooling medium inlet, the rack-level loop thermosiphon (11), the cooling medium circulating waste heat recovery device (8-2), the liquid reservoir (7) of the cooling medium outlet, and the liquid pump (4) circulating the cooling medium
using distilled water as the cooling medium for a first closed circulation structure under less than ambient pressure;
evacuating the first closed circulation structure and then filling it with nitrogen, so that the condensate system works at 0.1 atmospheric pressure after injecting the cooling medium;
forming a second closed circulation structure by the cabinet condensing unit (3), the condensate circulating waste heat recovery device (8-1), and the liquid pump (5) of the condensate system;
using water as the cooling medium by a second closed circulation structure at ambient pressure;
monitoring a condensate temperature by a condensing unit temperature sensor (22);
monitoring a CPU junction temperature by a first CPU temperature sensor (27-1) and a second CPU temperature sensor (27-2).

8. The heat dissipation method for the two-phase flow active and passive multi-level data center cabinet cooling device according to claim 7, wherein when the condensate temperature monitored by the condensing unit temperature sensor (22) is lower than a high temperature threshold of the condensate, a condensate inlet temperature control valve (23) and a condensate outlet temperature control valve (24) are both closed, and the liquid pump (5) of the condensate system is closed;
when the condensate temperature monitored by the condensing unit temperature sensor (22) is higher than the high temperature threshold of the condensate, the condensing unit temperature sensor (22) sends a signal to open the condensate inlet temperature control valve (23) and the condensate outlet temperature control valve (24) and start the liquid pump (5) of the condensate system to continuously inject condensate into the cabinet condensing unit (3);
when the condensate temperature monitored by the condensing unit temperature sensor (22) is lower than a low temperature threshold of the condensate, and the condensate inlet temperature control valve (23), the condensate outlet temperature control valve (24) and the liquid pump (5) of the condensate system are all in an open state, the condensing unit temperature sensor (22) sends a signal, the liquid pump (5) of the condensate system is closed, and then the condensate inlet temperature control valve (23) and the condensate outlet temperature control valve (24) are also closed one after another.

9. The heat dissipation method for the two-phase flow active and passive multi-level data center cabinet cooling device according to claim 7, wherein when the CPU junction temperature monitored by the first CPU temperature sensor (27-1) and the second CPU temperature sensor (27-2) is lower than a CPU high temperature threshold, a cooling medium inlet temperature control valve (19), a cooling medium outlet temperature control valve (20) and a gas valve (21) are all closed, and the rack-level loop thermosiphon (11) performs passive two-phase flow cooling;

when the CPU junction temperature monitored by the first CPU temperature sensor (27-1) or the second CPU temperature sensor (27-2) is higher than the CPU high temperature threshold, the sensor that exceeds the threshold temperature sends a signal, the cooling medium inlet temperature control valve (19) and the cooling medium outlet temperature control valve (20) are opened, the gas valve (21) is kept closed, the cooling medium in the liquid reservoir (6) at a high position and the cooling medium inlet flows to the rack-level loop thermosiphon (11), and to the liquid reservoir (7) at a low position and the cooling medium outlet through a pipeline, and the rack-level loop thermosiphon (11) begins to perform active two-phase flow cooling;

when the CPU junction temperature monitored by the first CPU temperature sensor (27-1) and the second CPU temperature sensor (27-2) is lower than a CPU low load threshold temperature, and the cooling medium inlet temperature control valve (19) and the cooling medium outlet temperature control valve (20) are opened, the first CPU temperature sensor (27-1) and the second CPU temperature sensor (27-2) send a signal, the cooling medium inlet temperature control valve (19) is closed, the gas valve (21) is opened, the cooling medium in the top pipeline of the rack-level loop thermosiphon (11) flows to the low-position liquid reservoir (7) at the cooling medium outlet, then the cooling medium outlet temperature control valve (20) and the gas valve (21) are closed, and the rack-level loop thermosiphon (11) returns to the passive two-phase flow cooling mode.

10. The heat dissipation method for the two-phase flow active and passive multi-level data center cabinet cooling device according to claim 9, wherein the cooling medium in a pipeline on a left side of the rack-level loop thermosiphon (11) flows into a fractal tree-like flow channel (35) in a thermal interface material (29) through a thermal interface material working cooling medium inlet pipeline (30), and flows out to a pipeline on a right side of the rack-level loop thermosiphon (11) via a thermal interface material cooling medium outlet pipeline (31);

a micro-cell (36) and a flow channel (37) in the ring structure of the thermal interface material form a micro thermosiphon.

* * * * *